(12) United States Patent
Kar-Roy et al.

(10) Patent No.: US 6,777,777 B1
(45) Date of Patent: Aug. 17, 2004

(54) HIGH DENSITY COMPOSITE MIM CAPACITOR WITH FLEXIBLE ROUTING IN SEMICONDUCTOR DIES

(75) Inventors: Arjun Kar-Roy, Irvine, CA (US); Marco Racanelli, Santa Ana, CA (US); Paul Kempf, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/447,397

(22) Filed: May 28, 2003

(51) Int. Cl.[7] .................................................. H01L 29/00

(52) U.S. Cl. .................... 257/532; 257/758; 257/310

(58) Field of Search ................................ 257/532, 758, 257/310

(56) References Cited

U.S. PATENT DOCUMENTS

2002/0192919 A1 * 12/2002 Bothra ........................ 438/381

* cited by examiner

Primary Examiner—Mark V. Prenty
(74) Attorney, Agent, or Firm—Farjami & Farjami LLP

(57) ABSTRACT

According to one embodiment, a structure comprises an electrode of a lower MIM capacitor situated in a first interconnect metal layer of a semiconductor die. The structure further comprises a shared electrode of the lower MIM capacitor and an upper MIM capacitor. The structure further comprises an electrode of the upper MIM capacitor situated over the shared electrode. The electrode of the upper MIM capacitor is coupled to the electrode of the lower MIM capacitor through vias and a second interconnect metal layer. In one embodiment, the electrode of the upper MIM capacitor can be divided into two or more segments to allow additional paths for connectivity to reduce the resistance of an electrode of the composite MIM capacitor. In other embodiments, a method for fabricating various embodiments of the composite MIM capacitor is disclosed.

12 Claims, 3 Drawing Sheets

HIGH DENSITY COMPOSITE MIM CAPACITOR WITH FLEXIBLE ROUTING IN SEMICONDUCTOR DIES

BACKGROUND OF THE INVENTION

1. Field of the Invention

The present invention is generally in the field of semiconductor fabrication. More specifically, the invention is in the field of fabrication of capacitors in semiconductor dies.

2. Background Art

High performance mixed signal and RF circuits require high density integrated capacitors. Metal-insulator-metal ("MIM") capacitors can be considered for use in the fabrication of integrated mixed signal and RF circuits on semiconductor dies. Disadvantageously, typical MIM capacitors have low capacitance density and since RF and mixed signal applications require high capacitance values, the die area consumed by typical MIM capacitors is too large and results in increased die costs to the manufacturer and the user.

Moreover, semiconductor dies that include typical MIM capacitors pose significant problems for interconnect routing because the metal plates used in the MIM capacitors prevent effective utilization of interconnect metal layers for their primary purpose, i.e. for interconnect routing. For example, use of several MIM capacitors or one large MIM capacitor would significantly hinder interconnect routing in a die. The reason is that large MIM capacitor plates would result in smaller available area for interconnect lines and would also require longer interconnect lines taking a "detour" around the large obstacles created by MIM capacitor plates present in the same interconnect metal layer where interconnect routing is to take place. Thus, lack of interconnect design flexibility and undesirably long interconnect lines, as well as consumption of significant die area by MIM capacitor plates are significant drawbacks in the use of MIM capacitors in mixed signal and RF applications.

Therefore, a need exists for mixed signal and RF MIM capacitors that are dense and that further do not adversely affect interconnect routing.

SUMMARY OF THE INVENTION

The present invention is directed to a high density composite MIM capacitor with flexible routing in semiconductor dies. The invention overcomes the need in the art for mixed signal and RF MIM capacitors that are dense and that do not adversely affect interconnect routing. The invention achieves a composite MIM capacitor having a capacitance with significantly improved density by building a composite MIM capacitor perpendicular to the surface of the die. Moreover, the present invention advantageously increases routing capability because the composite MIM capacitor is fabricated by utilizing the space amply available between interconnect metal layers and without significant use of interconnect metal layers.

According to one embodiment of the invention, a structure comprises an electrode of a lower MIM capacitor situated in a first interconnect metal layer of a semiconductor die. The first interconnect metal layer can be, for example, aluminum or copper, and is situated over a first interlayer dielectric layer. The structure further comprises a shared electrode of the lower MIM capacitor and an upper MIM capacitor. The shared electrode is situated above the electrode of the lower MIM capacitor and can comprise, for example, titanium nitride, tantalum nitride, or a stack comprising aluminum and titanium nitride or tantalum nitride. The structure further comprises an electrode of the upper MIM capacitor situated over the shared electrode. The electrode of the upper MIM capacitor is coupled to the electrode of the lower MIM capacitor through vias and a second interconnect metal layer. The electrode of the upper MIM capacitor can comprise, for example, titanium nitride or tantalum nitride.

The structure also comprises a lower MIM dielectric layer situated between the electrode of the lower MIM capacitor and the shared electrode; and an upper MIM dielectric layer situated between the shared electrode and the electrode of the upper MIM capacitor. The lower and upper MIM dielectric layers can comprise a high-k dielectric, for example, silicon nitride, tantalum pentoxide, aluminum oxide, hafnium oxide, zirconium oxide, zirconium aluminum silicate, hafnium silicate, hafnium aluminum silicate or other dielectrics with a relatively high dielectric constant. The structure further comprises a second interlayer dielectric layer situated between the first interconnect metal layer and the second interconnect metal layer. The second interlayer dielectric layer may comprise silicon oxide or a low-k dielectric, for example, porous silica, fluorinated amorphous carbon, fluoro-polymer, parylene, polyarylene ether, silsesquioxane, fluorinated silicon dioxide, or diamond-like carbon. The structure further comprises multiple vias situated in the second interlayer dielectric layer, wherein the multiple vias connect the electrodes of the lower and upper MIM capacitors to the second interconnect metal layer. The multiple vias can be, for example, tungsten or copper. The structure may further comprise multiple metal segments situated in the second interconnect metal layer. The multiple metal segments and multiple vias provide connectivity between the electrodes of the lower and upper MIM capacitors. In one embodiment, the electrode of the upper MIM capacitor can be divided into two or more segments to allow additional paths for connectivity to reduce the resistance of an electrode of the composite MIM capacitor. In other embodiments, the present invention is a method for fabricating various embodiments of the composite MIM capacitor. Other features and advantages of the present invention will become more readily apparent to those of ordinary skill in the art after reviewing the following description and accompanying drawings.

DETAILED DESCRIPTION OF THE INVENTION

The present invention is directed to a high density composite MIM capacitor with flexible routing in semiconductor dies. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
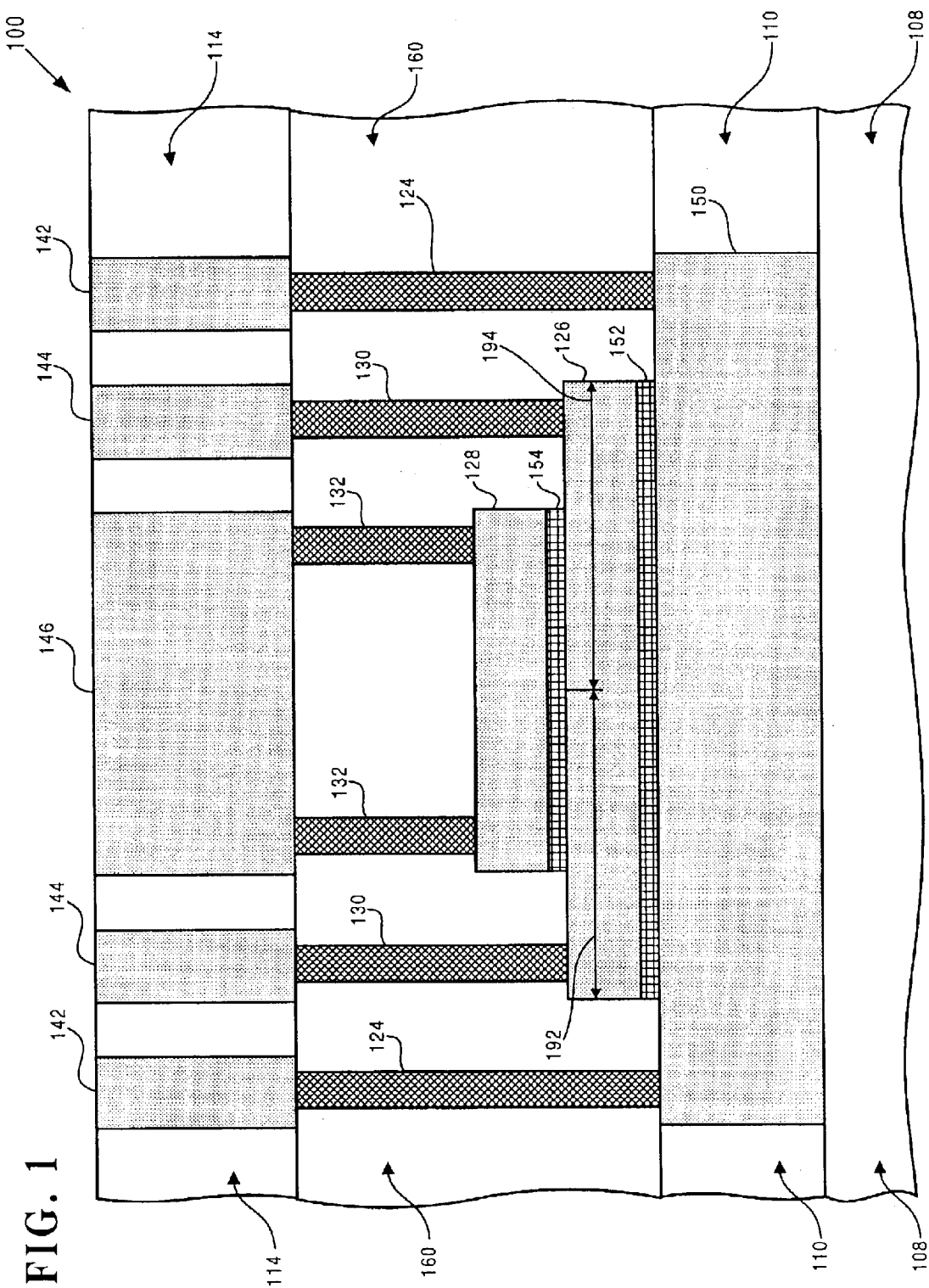
FIG. 1 shows a cross-sectional view of a composite MIM capacitor according to one embodiment of the invention.

FIG. 1 shows a cross-sectional view of a portion of a semiconductor die comprising an exemplary composite MIM capacitor in accordance with one exemplary embodiment of the present invention. As shown in FIG. 1, structure 100 includes, among other things, metal plate 128, dielectric segment 154, metal plate 126, dielectric segment 152 and metal plate 150 which is situated on interlayer dielectric 108. In structure 100, metal plate 128 and metal plate 126 form the two electrodes of an "upper" MIM capacitor and metal plate 126 and metal plate 150 form the two electrodes of a "lower" MIM capacitor. It is noted that, for the purpose of the present application, the "lower" MIM capacitor is defined as the MIM capacitor closer to interlayer dielectric 108 (i.e. closer to the substrate surface which is not shown) while the "upper" MIM capacitor is defined as the MIM capacitor further from interlayer dielectric 108 (i.e. further from the substrate surface which is not shown). Thus, metal plate 126 forms a shared electrode between the upper MIM capacitor (which is formed by metal plates 128 and 126) and the lower MIM capacitor (which is formed by metal plates 126 and 150).

Also shown in FIG. 1, metal plate 150 is situated on interlayer dielectric 108 in interconnect metal layer 110. In one embodiment, metal plate 150 is a "metal stack" comprising, for example, stacked layers of titanium nitride, tantalum nitride, titanium, and/or tantalum over a core portion of, for example, aluminum. Moreover, the top layer in the stack may be conditioned in oxygen, nitrogen, or hydrogen chemistries. By way of further example, metal plate 150 can have a thickness of between approximately 0.4 microns and approximately 0.8 microns. In the present embodiment, interconnect metal layer 110 can be a second interconnect metal layer in a semiconductor die. In other embodiments, interconnect metal layer 110 may be a first, third, fourth, or higher metal layer in a semiconductor die. As stated above, metal plate 150 forms one electrode of the lower MIM capacitor. To reduce parasitic interlayer capacitance, interlayer dielectric 160 can comprise a dielectric with a low dielectric constant, i.e. "a low-k dielectric," for example, and can be formed in a manner known in the art.

Further shown in FIG. 1, MIM capacitor dielectric segment 152 is situated on metal plate 150. In order to increase MIM capacitance, dielectric segment 152 can comprise silicon oxide, silicon nitride, tantalum pentoxide, aluminum oxide, hafnium oxide, zirconium oxide, zirconium aluminum silicate, hafnium silicate, hafnium aluminum silicate or other dielectrics with a relatively high dielectric constant (i.e. a high-k dielectric). By way of an example, dielectric segment 152 can have a thickness of between approximately 200.0 Angstroms and approximately 600.0 Angstroms and can be formed by depositing and patterning a layer of high-k dielectric material in a manner known in the art.

Also shown in FIG. 1, metal plate 126 is situated over dielectric segment 152 and can comprise, for example, titanium nitride, tantalum nitride, or a stack comprising aluminum and titanium nitride or tantalum nitride. Metal plate 126 can have a thickness of between approximately 1000.0 Angstroms and approximately 3000.0 Angstroms. Metal plate 126 can be formed by depositing and patterning a layer of titanium nitride or tantalum nitride. The layer of titanium nitride or tantalum nitride may be deposited using, for example, physical vapor deposition ("PVD") or chemical vapor deposition ("CVD") techniques. It is noted that, unlike metal plate 150, metal plate 126 is not formed in an interconnect metal layer. In other words, metal plate 126 is formed within interlayer dielectric 160, where conventionally no metal exists. As stated above, metal plate 126 forms a shared electrode between the upper and lower MIM capacitors. The shared electrode functions as an electrode of the lower MIM capacitor as well as an electrode of the upper MIM capacitor as discussed above.

Further shown in FIG. 1, MIM capacitor dielectric segment 154 is situated on metal plate 126 and can comprise silicon oxide, silicon nitride, tantalum pentoxide, aluminum oxide, hafnium oxide, zirconium oxide, zirconium aluminum silicate, hafnium silicate, hafnium aluminum silicate or other dielectrics with a relatively high dielectric constant (i.e. a high-k dielectric). Dielectric segment 154 can have a thickness of between approximately 200.0 Angstroms and approximately 600.0 Angstroms and can be formed by depositing and patterning a layer of high-k dielectric material.

Also shown in FIG. 1, metal plate 128 is situated over MIM capacitor dielectric segment 154 and can comprise, for example, titanium nitride, tantalum nitride, or a stack comprising aluminum and titanium nitride or tantalum nitride. Metal plate 128 can have a thickness of between approximately 1000.0 Angstroms and approximately 3000.0 Angstroms. Similar to metal plate 126, metal plate 128 may be deposited using, for example, PVD or CVD techniques and thereafter patterned. Metal plate 128 forms one electrode of the upper MIM capacitor as discussed above. Similar to metal plate 126, but unlike metal plate 150, metal plate 128 is not formed in an interconnect metal layer. In other words, metal plate 128 is formed within interlayer dielectric 160, where conventionally no metal exists.

Further shown in FIG. 1, interlayer dielectric 160 is situated over interconnect metal layer 110 and can comprise porous silica, fluorinated amorphous carbon, fluoropolymer, parylene, polyarylene ether, silsesquioxane, fluorinated silicon dioxide, diamond-like carbon, or other appropriate low-k dielectrics. Alternatively, interlayer dielectric 160 can comprise silicon oxide as known in the art. Interlayer dielectric 160 can be formed by depositing a layer of a suitable low-k dielectric or, alternatively, a layer of silicon oxide, over metal plate 150 using, for example, a CVD process. Interlayer dielectric 160 can have a thickness of between approximately 1.0 microns and approximately 4.0 microns. Also shown in FIG. 1, vias 124, vias 130 and vias 132 are situated in interlayer dielectric 160. In particular, vias 124 are situated over, and are in contact with, metal plate 150. Vias 130 are situated over, and are in contact with, metal plate 126 while vias 132 are situated over, and are in contact with, metal plate 128. Vias 124, 130, and 132 may be formed by etching interlayer dielectric 160 by a standard via etch process and the vias may be filled by a suitable electrically conducting material, such as tungsten or copper.

Further shown in FIG. 1, metal segments 142, metal segments 144 and metal segment 146 are situated in interconnect metal layer 114 over, and are in contact with, vias 124, vias 130 and vias 132, respectively. In the present exemplary embodiment, interconnect metal layer 114 is an immediately subsequent interconnect metal layer relative to interconnect metal layer 110 and, thus, no other interconnect metal layers are situated between interconnect metal layer 110 and interconnect metal layer 114. In the present embodiment, interconnect metal layer 114 can be a third metal layer in a semiconductor die. In other embodiments, interconnect metal layer 114 may be a second, fourth, fifth, sixth, or higher metal layer in a semiconductor die. Metal segments 142, metal segments 144 and metal segment 146 can comprise aluminum, copper, or other suitable metal and may be formed by depositing and patterning a layer of interconnect metal in a manner known in the art. Metal segments 142, metal segments 144 and metal segment 146 can have a thickness of between approximately 0.4 microns and approximately 0.8 microns. In one embodiment, metal segments 142, metal segments 144 and metal segment 146 can have a thickness of between approximately 0.5 microns and approximately 6.0 microns. It is noted that, in one embodiment, metal plate 128 is thicker than metal plate 126 so that the thicker metal plate 128 can act as a better etch stop for shallower vias 132 relative to thinner metal plate 126 which is used as etch stop for deeper vias 130.

As shown in FIG. 1, metal segments 142 are electrically connected to metal plate 150, i.e. one electrode of the lower MIM capacitor, by vias 124. Metal segments 144 are electrically connected to metal plate 126, i.e. the shared electrode, by vias 130. Moreover, metal segments 144 are shorted to each other in interconnect metal layer 114 or another interconnect metal layer. Metal segment 146 is electrically connected to metal plate 128, i.e. one electrode of the upper MIM capacitor, by vias 132. Although not illustrated in FIG. 1, metal segments 142 and metal segment 146 are shorted to each other to achieve a desired parallel configuration of the upper and lower MIM capacitors as will be discussed in more detail below. Metal segments 142 and metal segment 146 can be shorted to each other in the same metal layer, i.e. metal layer 114, or another metal layer, as desired (the routing and shorting of metal segments 142 and metal segment 146 are not shown in any of the Figures). Thus, metal plate 150, i.e. one electrode of the lower MIM capacitor, is electrically connected to metal plate 128, i.e., one electrode of the upper MIM capacitor, through vias 124, metal segments 142, metal segment 146 and vias 132.

As described above, one electrode of the lower MIM capacitor, i.e. metal plate 150, is electrically connected to one electrode of the upper MIM capacitor, i.e. metal plate 128. Also, the shared electrode, i.e. metal plate 126, functions as one electrode of the lower MIM capacitor as well as one electrode of the upper MIM capacitor. Therefore, the lower MIM capacitor is coupled in parallel with the upper MIM capacitor to form a composite MIM capacitor having a capacitance equal to the sum of capacitances of the upper and lower MIM capacitors.

Thus, by forming both the upper and lower MIM capacitors perpendicular to the surface of the die, and by coupling the upper MIM capacitor to the lower MIM capacitor in parallel, the present invention achieves a composite MIM capacitor having a capacitance value that is advantageously increased by utilizing the space amply available between interconnect metal layers. Also, by building two MIM capacitors both perpendicular to the surface of the die, instead of parallel to the surface of the die, the present invention advantageously achieves a composite MIM capacitor having significantly improved density per square micron of the die surface when compared to a MIM capacitor using only lateral space of the die.

The present invention further advantageously increases routing capability because the upper and lower MIM capacitors are fabricated using only two interconnect metal layers. With this configuration, the use of interconnect metal to build composite MIM capacitors is minimized. In other words, instead of utilizing additional interconnect metal layers to form capacitor metal plates, they (i.e. the capacitor metal plates) are formed from "special purpose" metal, such as metal plates 126 and 128, fabricated between two interconnect metal layers. Since use of interconnect metal to form capacitor metal plates is reduced, interconnect metal layers remain available for their primary purpose, i.e. for formation and routing of interconnect lines between various devices on the die.

As discussed above, the composite MIM capacitor in structure 100 includes two MIM capacitors connected in parallel and formed perpendicular to the surface of the die. However, it is noted that the invention's composite MIM capacitor can include any number of MIM capacitors connected in parallel and formed perpendicular to the surface of the die. Such MIM capacitors can be formed perpendicular to the surface of the die in the space available between interconnect metal layers 110 and 114. Alternatively, some of the MIM capacitors can be formed between interconnect metal layers 110 and 114 while other MIM capacitors can be formed between interconnect metal layer 114 and an interconnect metal layer above interconnect metal layer 114. However, in all embodiments, all of the MIM capacitors are made perpendicular to the surface of the die and are interconnected to each other to form a parallel combination giving rise to a composite MIM capacitor whose total capacitance is equal to the sum of capacitances of the individual MIM capacitors. As such, capacitance density is increased and use of lateral die space is minimized. Moreover, in all embodiments, the space amply available between interconnect metal layers is utilized and the use of interconnect metal layers to form capacitor plates is minimized. As such, interconnect metal layers remain available for their primary purpose, i.e. for interconnect routing.

Figure 2:
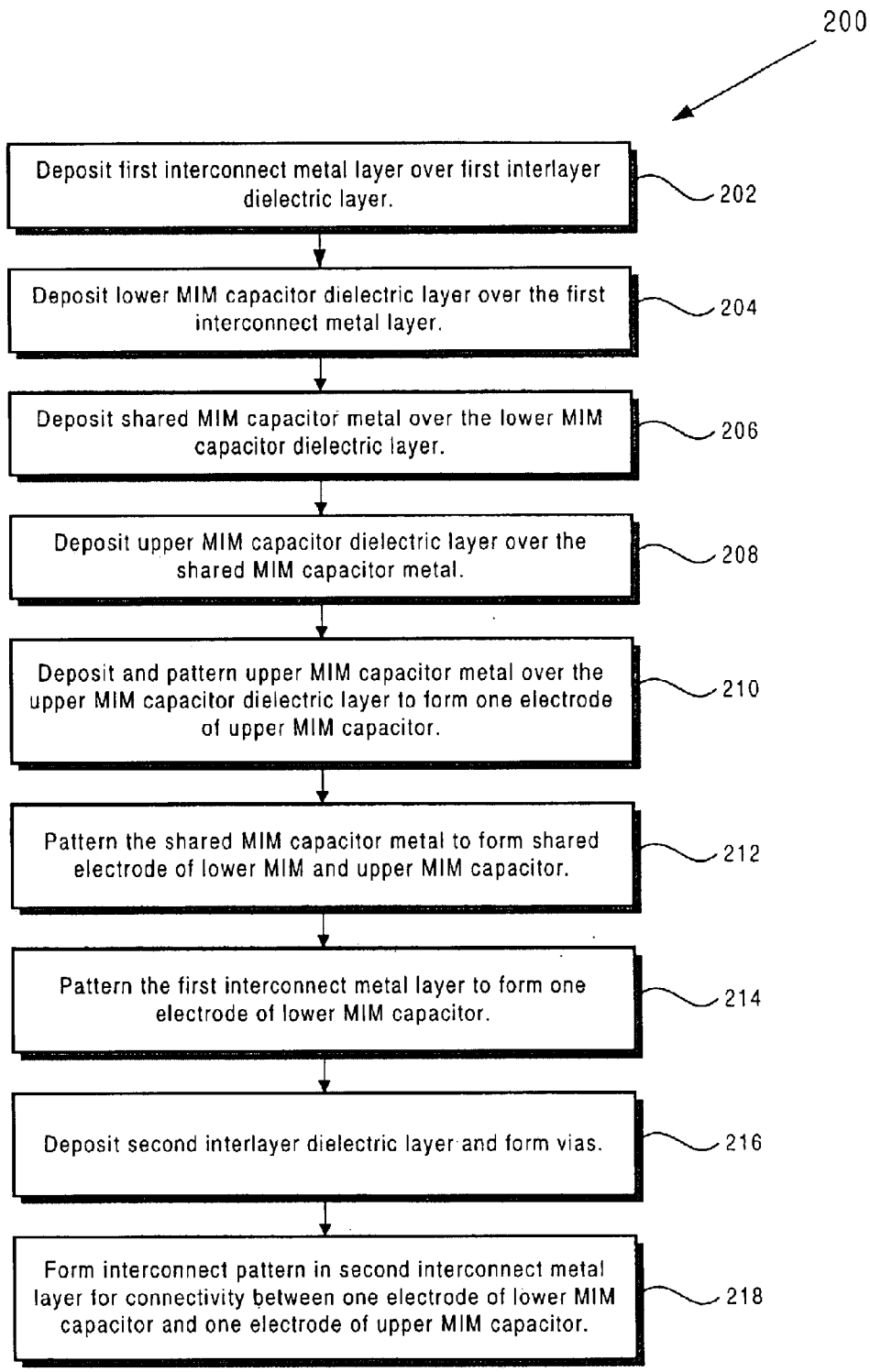
FIG. 2 shows a flowchart illustrating the steps taken to implement an embodiment of the invention.

The exemplary composite MIM capacitor shown in structure 100 can be fabricated using exemplary process steps shown in flowchart 200 of FIG. 2. Certain details and features have been left out of flowchart 200 that are apparent to a person of ordinary skill in the art. For example, a step may consist of one or more sub-steps or may involve specialized equipment or materials, as known in the art. Steps 202 through 218 indicated in flowchart 200 are sufficient to describe one embodiment of the present invention, other embodiments of the invention may utilize steps different from those shown in flowchart 200. It is noted that the processing steps shown in flowchart 200 are performed on a wafer which, prior to step 202, includes a first interlayer dielectric layer, i.e. interlayer dielectric 108 shown in FIG. 1.

At step 202 in flowchart 200, a first interconnect metal layer is deposited over the first interlayer dielectric layer, i.e. interlayer dielectric 108. The first interconnect metal layer, i.e. interconnect metal layer 110, for example, can be in metal level two of a semiconductor die. At step 204, a lower MIM capacitor dielectric layer comprising a high-k dielectric material such as silicon nitride, tantalum pentoxide, aluminum oxide, hafnium oxide, zirconium oxide, zirconium aluminum silicate, hafnium silicate, hafnium aluminum silicate, is deposited over the first interconnect metal layer. At step 206, a shared MIM capacitor metal comprising, for example, titanium nitride, tantalum nitride, or a stack comprising aluminum and titanium nitride or tantalum nitride, is deposited over the lower MIM capacitor dielectric layer. The shared MIM capacitor metal forms a shared electrode, i.e. one electrode of a lower MIM capacitor and one electrode of an upper MIM capacitor, as described below.

At step 208, an upper MIM capacitor dielectric layer comprising a high-k dielectric material is deposited over the shared MIM capacitor metal. At step 210, an upper MIM capacitor metal comprising, for example, titanium nitride, tantalum nitride, or a stack comprising aluminum and titanium nitride or tantalum nitride, is deposited and patterned over the upper MIM capacitor dielectric layer to form one electrode of the upper MIM capacitor, i.e. metal plate 128.

At step 212, the shared MIM capacitor metal is patterned to form the shared electrode, i.e. metal plate 126, i.e. an electrode of both the upper and lower MIM capacitors. At step 214, the first interconnect metal layer is patterned to form one electrode of the lower MIM capacitor, i.e. metal plate 150. At step 216, a second interlayer dielectric layer, i.e. interlayer dielectric 160, is deposited over the upper MIM capacitor, the lower MIM capacitor, and interconnect metal layer 110. The second interlayer dielectric layer can comprise silicon oxide or a low-k dielectric such as porous silica, fluorinated amorphous carbon, fluoro-polymer, parylene, polyarylene ether, silsesquioxane, fluorinated silicon dioxide, or diamond-like carbon. Also at step 216, vias are formed over, and make contact with, the electrodes of the upper and lower MIM capacitors. Vias formed at step 216 include vias 124, 130, and 132 which may be formed by etching the second interlayer dielectric layer by a standard via etch process and can be filled by a suitable electrically conductive material such as tungsten or copper.

At step 218, an interconnect pattern is formed in a second interconnect metal layer for connectivity between one electrode of the lower MIM capacitor, i.e. metal plate 150, and one electrode of the upper MIM capacitor, i.e. metal plate 128. The second interconnect metal layer, i.e. interconnect metal layer 114, is deposited and patterned over the second interlayer dielectric layer, i.e. interlayer dielectric 160, to form metal segments 142, 144, 146 in a manner known in the art. As described above, metal segments 142, metal segments 144 and metal segment 146 are in contact with vias 124, 130, and 132, respectively. In the present exemplary embodiment, the second interconnect metal layer is an immediately subsequent interconnect metal layer relative to the first interconnect metal layer. In the present embodiment, the second interconnect metal layer can be a third metal level in the semiconductor die. As stated above, metal segments 142, metal segments 144 and metal segment 146 can comprise aluminum, copper, or other suitable metal. Metal segments 142 and metal segment 146 are shorted to each other to achieve a desired parallel configuration of the upper and lower MIM capacitors. Metal segments 142 and metal segment 146 can be shorted to each other in the second interconnect metal layer or another metal layer, as desired.

Figure 3:
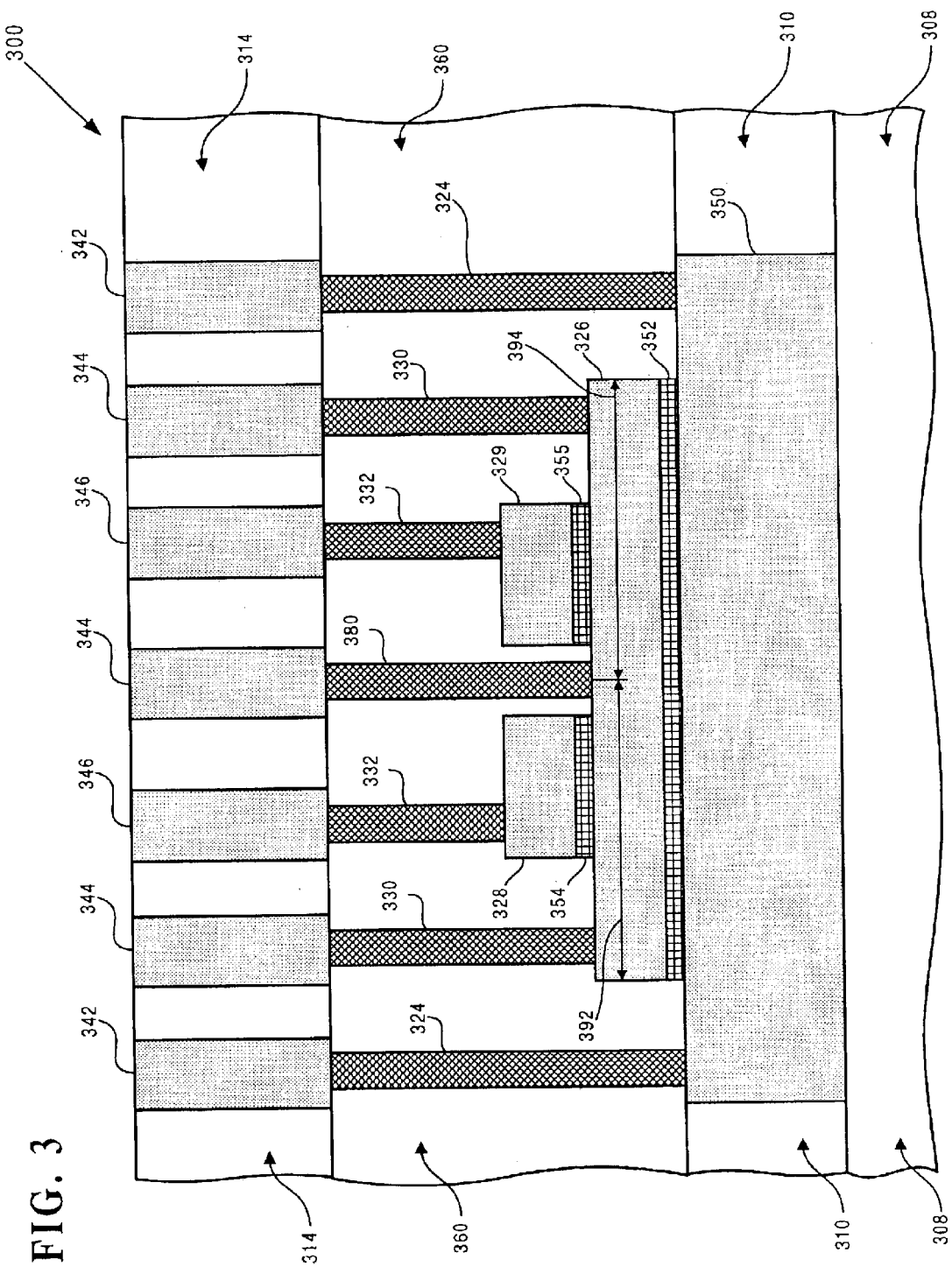
FIG. 3 shows a cross-sectional view of a composite MIM capacitor according to one embodiment of the invention.

FIG. 3 shows a cross-sectional view of a portion of a semiconductor die comprising a composite MIM capacitor in accordance with another exemplary embodiment of the present invention. As shown in FIG. 3, structure 300 includes, among other things, metal plate 328, metal plate 329, dielectric segment 354, dielectric segment 355, metal plate 326, dielectric segment 352 and metal plate 350 which is situated on interlayer dielectric 308. In structure 300, metal plate 328, metal plate 329, and metal plate 326 form the two electrodes of an upper MIM capacitor and metal plate 326 and metal plate 350 form the two electrodes of a lower MIM capacitor. Thus, metal plate 326 forms a shared electrode between the upper MIM capacitor (which is formed by metal plates 328, 329 and 326) and the lower MIM capacitor (which is formed by metal plates 326 and 350).

Also shown in FIG. 3, metal plate 350 is situated on interlayer dielectric 308 in interconnect metal layer 310. Metal plate 350, interlayer dielectric 308, and interconnect metal layer 310 are similar in composition, thickness and formation to metal plate 150, interlayer dielectric 108, and interconnect metal layer 310, respectively. More specifically, in one embodiment, metal plate 350 is a "metal stack" comprising, for example, stacked layers of titanium nitride, tantalum nitride, titanium, and/or tantalum over a core portion of, for example, aluminum. Moreover, the top layer in the stack may be conditioned in oxygen, nitrogen, or hydrogen chemistries. As stated above, metal plate 350 forms one electrode of the lower MIM capacitor. Further shown in FIG. 3, dielectric segment 352 is situated on metal plate 350. Dielectric segment 352 is similar in composition, thickness and formation to dielectric segment 152.

Also shown in FIG. 3, metal plate 326 is situated on dielectric segment 352. Metal plate 326 is similar in composition, thickness and formation to metal plate 126. As stated above, metal plate 326 forms the shared electrode of the lower MIM capacitor and the upper MIM capacitor. Further shown in FIG. 3, dielectric segment 354 and dielectric segment 355 are situated on metal plate 326. Dielectric segments 354, 355 are similar in composition, thickness and formation to dielectric segment 154.

Also shown in FIG. 3, metal plate 328 and metal plate 329 are situated on dielectric segment 354 and dielectric segment 355, respectively. Metal plates 328 and 329 are similar in composition, thickness and formation to metal plate 128. As stated above, metal plates 328 and 329, together, form one electrode of the upper MIM capacitor. Further shown in FIG. 3, interlayer dielectric 360 is situated over metal layer 310. Interlayer dielectric 360 is substantially similar in composition, thickness and formation to interlayer dielectric 160.

Also shown in FIG. 3, vias 324, vias 330, via 380, and vias 332 are situated in interlayer dielectric 360. In particular, vias 324 are situated over, and are in contact with, metal plate 350. Vias 330 and via 380 are situated over, and are in contact with, metal plate 326 while vias 332 are situated over, and are in contact with, metal plate 328 and metal plate 329. Vias 324, 330, 380 and 332 may be formed by etching interlayer dielectric 360 by a standard via etch process and the vias may be filled by a suitable electrically conducting material, such as tungsten or copper.

Further shown in FIG. 3, metal segments 342, metal segments 344 and metal segments 346 are situated in interconnect metal layer 314 over, and are in contact with, vias 324, vias 330, 380 and vias 332, respectively. In the present exemplary embodiment, interconnect metal layer 314 is an immediately subsequent interconnect metal layer relative to interconnect metal layer 310 and, thus, no other interconnect metal layers are situated between interconnect metal layer 310 and interconnect metal layer 314. Interconnect metal layer 314 is similar in composition, thickness and formation to interconnect metal layer 114. Metal segments 342, metal segments 344 and metal segments 346 are similar in composition, thickness and formation to metal segments 142, metal segments 144 and metal segment 146, respectively.

As shown in FIG. 3, metal segments 342 are electrically connected to metal plate 350, i.e. one electrode of the lower MIM capacitor, by vias 324. Metal segments 344 are electrically connected to metal plate 326, i.e. the shared electrode, by vias 330 and via 380. Moreover, metal segments 344 are shorted to each other in interconnect metal layer 314 or another interconnect metal layer. Metal segments 346 are electrically connected to metal plate 328 and metal plate 329, i.e. one electrode of the upper MIM capacitor, by vias 332. Metal segments 342 and metal segments 346 are shorted to each other to achieve a desired parallel configuration of the upper and lower MIM capacitors in a manner substantially similar to metal segments 142 and metal segment 146. Thus, metal plate 350, i.e. one electrode of the lower MIM capacitor, is electrically connected to metal plate 328 and metal plate 329, i.e., one electrode of the upper MIM capacitor, through vias 324, metal segments 342, metal segments 346 and vias 332.

As described above, one electrode of the lower MIM capacitor, i.e. metal plate 350, is electrically connected to one electrode of the upper MIM capacitor, i.e. metal plates 328 and 329. Also, the shared electrode, i.e. metal plate 326, functions as one electrode of the lower MIM capacitor as well as one electrode of the upper MIM capacitor. Therefore, the lower MIM capacitor is coupled in parallel with the upper MIM capacitor to form a composite MIM capacitor having a capacitance equal to the sum of capacitances of the upper and lower MIM capacitors.

As shown in FIG. 3, one electrode of the upper MIM capacitor is divided into two segments, i.e. metal plates 328 and 329. The dielectric of the upper MIM capacitor also comprises two segments, i.e. dielectric segments 354 and 355. In this manner, an additional path is provided to connect metal plate 326 to metal segment 344 through via 380. It is noted that via 380 is also referred to as a "resistance reducing via" in the present application. Although not shown in structure 300, metal segments 344 are shorted to each other either in metal layer 314 or in another metal layer. Because of via 380, metal segment 344 connected to via 380, and also vias 330 and metal segments 344 connected to vias 330, and the shorting together of metal segments 344 as stated above, the equivalent resistance of metal plate 326 in the composite MIM capacitor of structure 300 is substantially less than the equivalent resistance of metal plate 126 in the composite MIM capacitor of structure 100. It is noted that an electrode of the invention's MIM composite capacitor can be divided into any number of sub-segments to further reduce the equivalent resistance of that electrode.

An exemplary method to fabricate structure 300 of the present invention is substantially similar to the exemplary fabrication method of structure 100 described in relation to flowchart 200 of FIG. 2 and, thus, identical steps are not described hereinbelow. More specifically, steps 202 through 208 of flowchart 200 described above with regard to fabricating structure 100 are identical to fabricating structure 300 and, thus, are not described again. At step 210, an upper MIM capacitor metal comprising, for example, titanium nitride or tantalum nitride is deposited and patterned over the upper MIM capacitor dielectric layer to form metal plates 328 and 329 as one electrode of the upper MIM capacitor.

Steps 212 and 214 of flowchart 200 described above with regard to fabricating structure 100 are identical to fabricating structure 300 and, thus, are not described again. At step 216, a second interlayer dielectric layer, i.e. interlayer dielectric 360 is deposited over the upper MIM capacitor, the lower MIM capacitor, and interconnect metal layer 310. The second interlayer dielectric layer can comprise silicon oxide or a low-k dielectric such as porous silica, fluorinated amorphous carbon, fluoro-polymer, parylene, polyarylene ether, silsesquioxane, fluorinated silicon dioxide, or diamond-like carbon. Also at step 216, vias 324 are fabricated over, and make contact with, one electrode of the lower MIM capacitor, i.e. metal plate 350. Vias 330 and via 380 are fabricated over, and make contact with, the shared electrode, i.e. metal plate 326. Vias 332 are fabricated over, and make contact with, one electrode of the upper MIM capacitor, i.e. metal plates 329 and 328. Vias 324, 330, 380 and 332 may be formed by etching the second interlayer dielectric layer by a standard via etch process and can be filled by a suitable electrically conductive material such as tungsten or copper.

At step 218, an interconnect pattern is formed in the second interconnect metal layer, i.e. interconnect metal layer 314, for connectivity between one electrode of the lower MIM capacitor, i.e. metal plate 350, and one electrode of the upper MIM capacitor, i.e. metal plates 328 and 329. Interconnect metal layer 314 is deposited and patterned over the second interlayer dielectric, i.e. interlayer dielectric 360, to form metal segments 342, 344, and 346 which are interconnected to each other at interconnect metal layer 314 or at another interconnect metal layer as described above.

As with the embodiment of the invention shown as the composite MIM capacitor in structure 100, the composite MIM capacitor in structure 300 also results in the achievement of two MIM capacitors fabricated perpendicular to the surface of the die and interconnected to form a parallel combination giving rise to a composite MIM capacitor whose total capacitance is equal to the sum of capacitances of the individual MIM capacitors. As such, capacitance density is increased while use of lateral die space is minimized. Moreover, as in all embodiments, the space amply available between interconnect metal layers is utilized and the use of interconnect metal layers to form capacitor plates is minimized. As such, interconnect metal layers remain available for their primary purpose, i.e. for interconnect routing. Furthermore, in the embodiment shown as composite MIM capacitor in structure 300, the resistance of MIM capacitor electrodes can be significantly reduced as described above.

From the above description of the invention it is manifest that various techniques can be used for implementing the concepts of the present invention without departing from its scope. Moreover, while the invention has been described with specific reference to certain embodiments, a person of ordinary skills in the semiconductor fabrication art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high density composite MIM capacitor with flexible routing in semiconductor dies has been described.

What is claimed is:

1. A composite capacitor comprising:

lower metal plate situated in a first interconnect metal layer in a semiconductor die, said lower metal plate forming an electrode of a lower capacitor of said composite capacitor;

a shared metal plate situated above said lower metal plate forming a shared electrode of said lower capacitor and an upper capacitor of said composite capacitor;

an upper metal plate situated above said shared metal plate forming an electrode of said upper capacitor, said shared metal plate and said upper metal plate being formed within an interlayer dielectric;

said lower metal plate being connected to said upper metal plate such that said composite capacitor is a parallel combination of said lower capacitor and said upper capacitor.

2. The composite capacitor of claim 1 wherein said lower metal plate is connected to said upper metal plate through a second interconnect metal layer in said semiconductor die, wherein said interlayer dielectric layer is situated between said first interconnect metal layer and said second interconnect metal layer.

3. The composite capacitor of claim 1 further comprising:
a lower high-k dielectric situated between said lower metal plate and said shared metal plate;
an upper high-k dielectric situated between said shared metal plate and said upper metal plate.

4. The composite capacitor of claim 3 wherein said lower high-k dielectric is selected from the group consisting of silicon oxide, silicon nitride, tantalum pentoxide, aluminum oxide, haftium oxide, zirconium oxide, zirconium aluminum silicate, hafnium silicate, and hafnium aluminum silicate.

5. The composite capacitor of claim 3 wherein said upper high-k dielectric is selected from the group consisting of silicon oxide, silicon nitride, tantalum pentoxide, aluminum oxide, hafnium oxide, zirconium oxide, zirconium aluminum silicate, hafnium silicate, and hafnium aluminum silicate.

6. The composite capacitor of claim 2 further comprising:
a plurality of vias situated in said interlayer dielectric layer, said plurality of vias connecting said lower metal plate, said shared metal plate and said upper metal plate to said second interconnect metal layer.

7. The composite capacitor of claim 6 wherein said interlayer dielectric layer comprises a low-k dielectric.

8. The composite capacitor of claim 7 wherein said low-k dielectric is selected from the group consisting of porous silica, fluorinated amorphous carbon, fluoro-polymer, parylene, polyarylene ether, silsesquioxane, fluorinated silicon dioxide, and diamond-like carbon.

9. The composite capacitor of claim 2 further comprising:
a first plurality of metal segments situated in said second interconnect metal layer, said first plurality of metal segments being connected to said lower metal plate by a first plurality of vias;
a second plurality of metal segments situated in said second interconnect metal layer, said second plurality of metal segments being connected to said shared metal plate by a second plurality of vias;
a third plurality of metal segments situated in said second interconnect metal layer, said third plurality of metal segments being connected to said upper metal plate by a third plurality of vias;
said first plurality of metal segments being connected to said third plurality of metal segments.

10. The composite capacitor of claim 9 wherein said second plurality of metal segments are connected together.

11. The composite capacitor of claim 1 wherein said shared metal plate and said upper metal plate comprise metal selected from the group consisting of titanium nitride, tantalum nitride, and aluminum.

12. The composite capacitor of claim 1 wherein said upper metal plate comprises a plurality of segments and at least one resistance reducing via situated between said plurality of segments, said resistance reducing via contacting said shared electrode to reduce a resistance of said shared electrode.

* * * * *